United States Patent [19]

Schovanec

[11] Patent Number: 5,134,094
[45] Date of Patent: Jul. 28, 1992

[54] SINGLE INLINE PACKAGED SOLID STATE RELAY WITH HIGH CURRENT DENSITY CAPABILITY

[75] Inventor: Lada Schovanec, Spring Valley, Calif.

[73] Assignee: Silicon Power Corporation, Long Beach, Calif.

[21] Appl. No.: 734,200

[22] Filed: Jul. 22, 1991

[51] Int. Cl.⁵ .................................................. H01L 21/60
[52] U.S. Cl. .................................... 437/209; 437/217; 437/221; 357/70
[58] Field of Search ............... 437/209, 211, 217, 215, 437/221; 357/70, 71

[56] References Cited

U.S. PATENT DOCUMENTS

| | | | |
|---|---|---|---|
| 3,723,769 | 3/1973 | Collins | 307/252 |
| 4,172,272 | 10/1979 | Schneider | 361/386 |
| 4,471,158 | 9/1984 | Roberts | 357/70 |
| 4,725,692 | 2/1988 | Ishit et al. | 357/70 |
| 4,855,809 | 8/1989 | Malhi et al. | 357/71 |
| 4,893,168 | 1/1990 | Takahashi | 437/209 |
| 5,012,323 | 4/1991 | Farnworth | 357/70 |
| 5,036,024 | 7/1991 | Mine et al. | 437/211 |

Primary Examiner—Brian E. Hearn
Assistant Examiner—Kevin M. Picardas
Attorney, Agent, or Firm—Law Offices of Thomas E. Schatzel

[57] ABSTRACT

An AC solid state relay in a single inline package (SIP) comprised of dual silicon controlled rectifiers (SCRs) with a supporting circuitry mounted directly on an alumina substrate with molecularly bonded copper metalization layers and heat spreader all coated in a thermally conductive epoxy. And a DC solid state relay in a single inline package (SIP) comprised of an NPN power transistor with a supporting circuitry mounted directly on an alumina substrate with molecularly bonded copper metalization layers and heat spreader all coated in a thermally conductive epoxy.

3 Claims, 3 Drawing Sheets

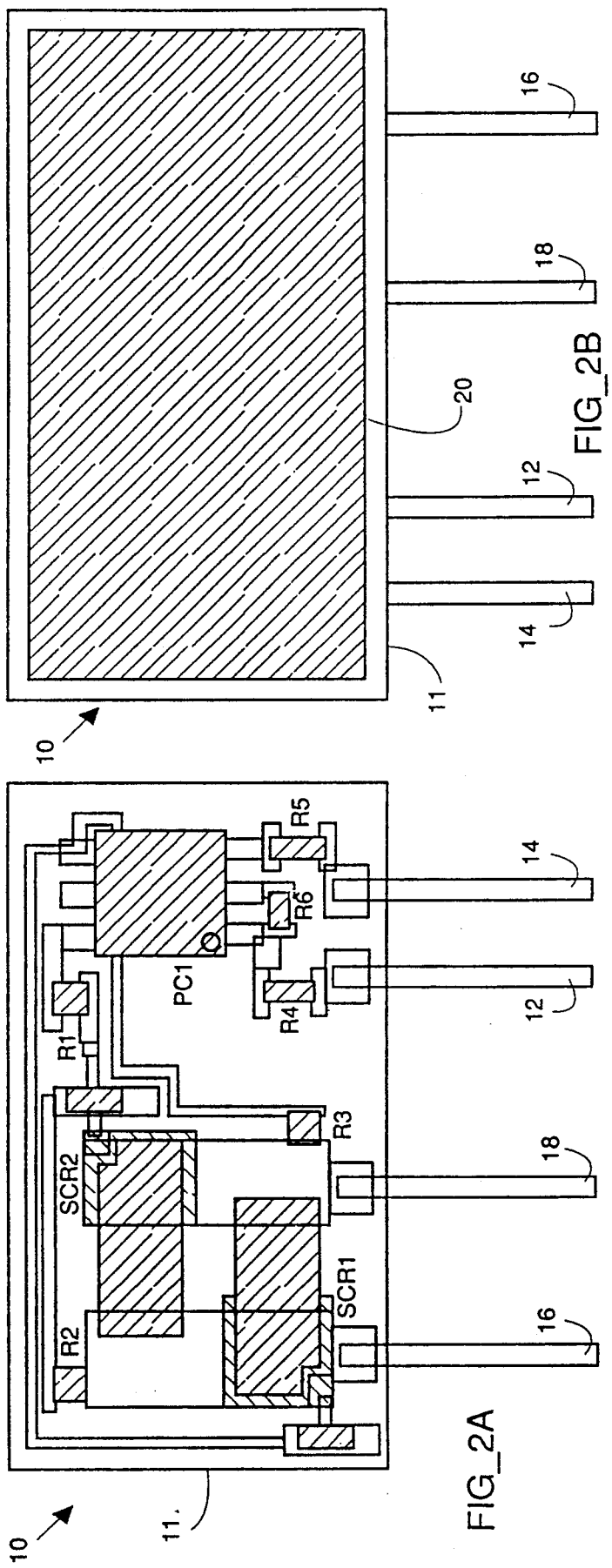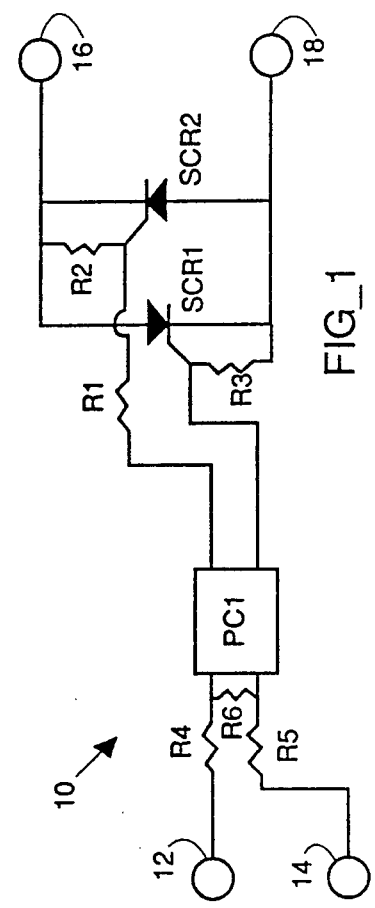

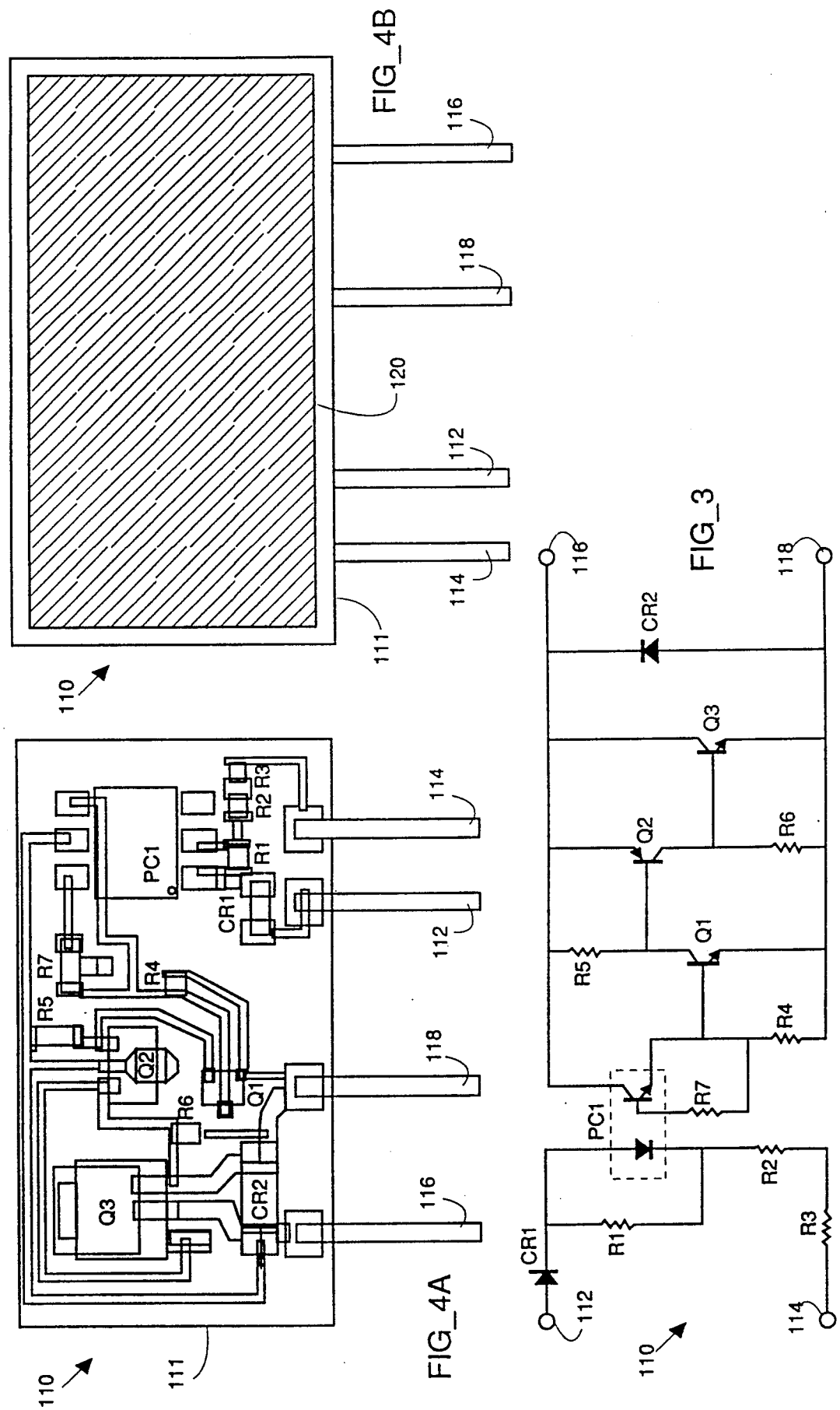

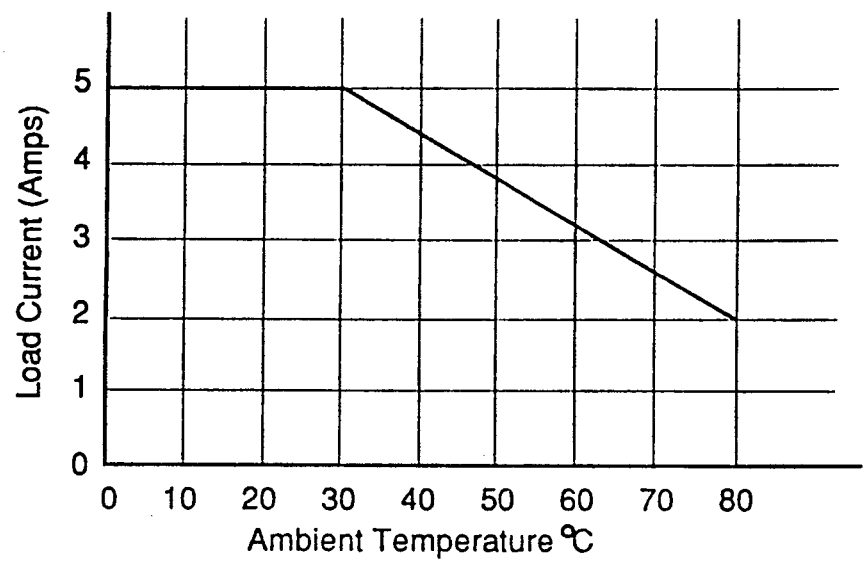
FIG_5
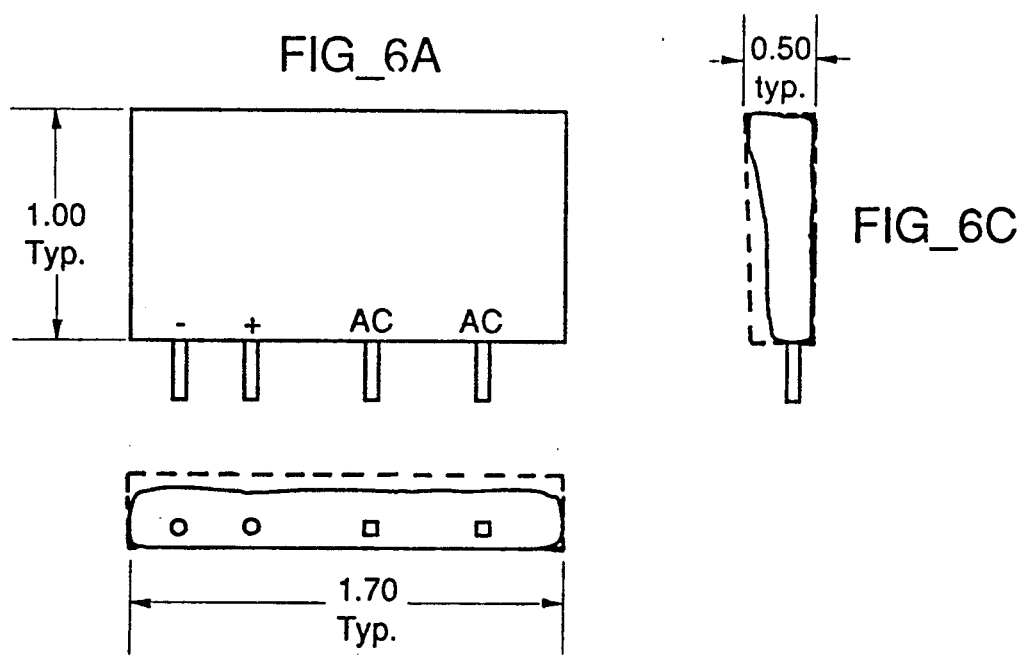
FIG_6A
FIG_6C
FIG_6B

SINGLE INLINE PACKAGED SOLID STATE RELAY WITH HIGH CURRENT DENSITY CAPABILITY

BACKGROUND OF THE INVENTION

1. Field of the Invention

The invention relates generally to solid state relays and more specifically to small solid state relays, under twelve hundred watts, capable of switching AC and DC currents and of being constructed in a single inline package (SIP).

2. Description of the Prior Art

As electromechanical devices, relays have filled an important role in controlling large voltages and currents with relatively low control powers applied to the coils of the relays. Relays have also served to isolate the controlling circuit from the controlled circuit.

Advances in semiconductor technology have allowed the substitution of electromechanical relays with solid state relays. A practical limitation to how much power a solid state relay can switch has been the heat dissipation capability of the actual switching device and its package. Both silicon controlled rectifiers (SCRs) and triacs are used in solid state relays and the load that can be placed on a solid state relay is a function of the SCR/triac device rating and the thermal resistance of device junction to the ambient air (for air cooling).

Schneider describes, in U.S. Pat. No. 4,172,272, issued Oct. 23, 1979, a solid state relay package that has a U-shaped metal frame. The open end of the frame receives a circuit board containing most of the relay components and is potted in place with a solid plastic insulation material. Schneider states that his package doubles the current rating of a given relay circuit because his metal frame is so efficient at removing heat. A triac assembly (31 in FIG. 9) is mounted to the interior bottom of the metal frame by cementing or soldering. The use of a triac in this fashion severely limits the kinds of loads that can be applied to the relay, since an adequate dv/dt change in the control voltage must be maintained. Inductive loads, such as are found with motors, are either curtailed or not allowed at all. The single triac device, as a switch point, tends to concentrate the heat the relay must dissipate, and the efficiency with which heat is transferred from the junction of the triac to the metal frame and then to the air limits the overall power rating of the relay.

An earlier patent by Collins, U.S. Pat. No. 3,723,769, issued Mar. 27, 1973, describes an optically isolated signal circuit for a solid state relay. The relay also has zero-crossing switching with a full-wave bridge to reduce any radio interference that might otherwise be generated. An AC load is controlled by two thyristors connected in inverse parallel such that each handles an opposite half cycle to the other. Collins suggests that a triac can be used to replace the thyristors, and yet does not address the dissipation of the heat generated in any of these devices, while Schneider is addressed to substantially only to the heat dissipation issue.

Copy machines and printers use high intensity halogen lamps that must be turned-on quickly. The initial surge current into one of these lamps can be very high and exceed the capabilities of triac based solid state relays. Halogen lamps have much higher inrush currents than do incandescent lamps. For a given area, a prior art solid state relay having a triac with an eighty amp surge capability will be unreliable because the maximum surge currents are being exceeded. With the present invention, the maximum surge current handling capability can be raised in a device having the same area to 250 amp (using 180 mils $^2$ chips), and to 500 amp (using 240 mils$^2$ chips).

SUMMARY OF THE PRESENT INVENTION

It is therefore an object of the present invention to produce a solid state relay having improved load capabilities for a given size package.

Briefly, in a preferred embodiment of the present invention, a solid state relay comprised of dual silicon controlled rectifiers (SCRs) or one NPN bipolar transistor with the supporting circuitry is mounted directly on an alumina substrate with copper metallization and heat spreader and dipped in a thermally conductive epoxy.

An advantage of the present invention is that the surge capability of a solid state relay is improved.

Another advantage of the present invention is that higher currents can be sustained by a solid state relay.

Another advantage of the present invention is that load restrictions endemic to triacs are eliminated.

Another advantage of the present invention is that solid state relay device reliability is improved for a given package size and load.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a schematic diagram of a first embodiment of an AC output solid state relay made in accordance with the present invention;

FIGS. 2A and 2B are a front and back views, respectively, of the relay of FIG. 1, showing the alumina substrate, SCR chips, heat spreader, input/output pins, and thick film components;

FIG. 3 is a schematic diagram of a second embodiment of a DC output solid state relay made in accordance with the present invention;

FIGS. 4A and 4B are a front and back views, respectively, of the relay of FIG. 3, showing the alumina substrate, NPN transistor, heat spreader, input/output pins, and thick film components;

FIG. 5 is a typical derating curve for the solid state relay of FIG. 1; and

FIGS. 6A, 6B, and 6C are a front, bottom, and end view, respectively, of a typical SIP package suitable for the solid state relay of FIG. 1.

DETAILED DESCRIPTION OF THE PREFERRED EMBODIMENTS

FIGS. 1, 2A, and 2B illustrate an AC solid state relay SIP assembly 10 comprising an alumina ceramic substrate 11, having input/output pins 12, 14, 16, and 18, and a heat spreader 20. Heat spreader 20 is preferably copper metallization which is about 0.002 inches thick and is deposited onto substrate 11, as are the circuit traces on the opposite side of substrate 11 that interconnect various components that form the solid state relay circuit. Thick film resistor R1 is 470Ω, resistors R2 and R3 are 47Ω, R4 and R5 are 150Ω, and R6 is 820Ω. Thick film resistors can be substituted by discrete, leadless versions. PC1 is Siemens type IL420, or equivalent, integrated circuit for non-zero-crossing applications and a Toshiba TLP3063 or equivalent in zero-crossing alternative embodiments. Silicon controlled rectifiers SCR1 and SCR2 are dice 180 or 250 mils square and are conductively cemented or soldered to metallization pads on the front side of substrate 11 such that heat is drawn from SCR1 and SCR2 into substrate 11 and spread by heat spreader 20. The output power chips are covered by one of the commonly used materials such as SILGAN J-500 or an equivalent for mechanical protection. Preferably, solid state relay 10 is then dipped in a thermally conductive epoxy to completely seal substrate 11 and all the components attached to it and may cover the tops of input/output pins 12, 14, 16, and 18. An acceptable epoxy supplier is Hysol Corporation. The epoxy covering (not shown for clarity of the above description) protects the components of relay assembly 10 from moisture and abrasion and provides electrical insulation. The covering will ideally also add some mechanical strength to the assembly and help spread heat generated by SCR1 and SCR2 uniformly around relay assembly 10. In an exemplary embodiment, substrate 11 is 96% alumina 0.025 inches thick, 0.85 inches wide, and 1.60 inches long. A dielectric glass layer using overglaze ink #8509 (EMCA), or equivalent, may be applied. Input/output pins 12, 14, 16, and 18 protrude 0.36 inches and are separated 0.20 inches to 0.49 inches apart from one another. The following Tables I and II list the exemplary input and output specifications of solid state relay assembly 10 in the non-zero-crossing alternative embodiment.

TABLE I

| INPUT SPECIFICATIONS | | | | |
|---|---|---|---|---|
| CHARACTERISTIC | UNIT | MIN | TYP | MAX |
| $V_{control}$ Range | VDC | 3 | 5 | 15 |
| $I_{control}$ Range | mA | 7 | 14 | 47 |
| $V_{pick-up}$ | VDC | | | 3 |
| $V_{drop-out}$ | VDC | 1 | | |
| $V_{reverse}$ Protection | VDC | | | 15 |
| Input Resistance | Ohms | | 300 | |

TABLE II

| OUTPUT SPECIFICATIONS @ 25° C. | | | | | |
|---|---|---|---|---|---|
| CHARAC-TERISTIC | CONDI-TION | UNIT | MIN | TYP | MAX |
| $V_{load}$ | 47-63 Hz | VRMS | 12 | 120/240 | 280 |
| $V_{peak\ blocking}$ | Repetitive | VPK | 600 | | |
| $I_{load}$ (note 1) | Continuous | ARMS | 0.05 | | 5 |
| $I_{surge}$ (note 2) | one cycle | APK | | | 250 |
| $I_{leakage}$ | Off-State @ 280 VRMS | mARMS | | | 1.0 |
| On-State Voltage Drop | $I_{load}$ = MAX | VPK | | 1.1 | 1.6 |
| Static dv/dt | Off-State | V/μS | 500 | | |
| Turn-On Time | | μS | | | 20 |
| Turn-Off Time | | mS | | | 8.3 |
| $I^2t$ Rating | t = 8.3 mS | $A^2S$ | | | 260 | note 1: For temps. ≧ 30° C., see derating curve (FIG. 5).
note 2: Alternative 500A surge embodiment possible.

FIGS. 3, 4A, and 4B illustrate a DC solid state relay SIP assembly 110 comprising an alumina ceramic substrate 111, having input/output pins 112, 114, 116, and 118, and a heat spreader 120. Heat spreader 120 is preferably copper metallization which is about 400 micro inches thick and is deposited onto substrate 111, as are the circuit traces on the opposite side of substrate 111 that interconnect various components that form the solid state relay circuit. Thick film resistor R1 is 10KΩ,
resistors R2 and R3 are 750Ω, resistor R4 is 62KΩ, resistor R5 is 22KΩ, resistor R6 is 1KΩ, and resistor R7 is 680KΩ. Thick film resistors may be substituted by discrete, leadless versions. PC1 is an opto-coupler. Transistor Q1 is a NPN in an industry standard semiconductor package commonly known as "SOT-23", transistor Q2 is a PNP in an industry standard "SOT-89" package, and Q3 is an industry standard "D-Pack" type NPN power transistor cemented or soldered to metallization pads on the front side of substrate 111 such that heat is drawn from Q3 into substrate 111 and spread by heat spreader 120. Q3 may be in chip form. Preferably, solid state relay 110 is dipped in a thermally conductive epoxy to completely seal substrate 111 and all the components attached to it and may cover the tops of input/output pins 112, 114, 116, and 118. The epoxy covering (not shown for clarity of the above description) protects the components of relay assembly 110 from moisture and abrasion and provides electrical insulation. The covering will ideally also add some mechanical strength to the assembly and help spread heat generated mainly by Q3 uniformly around relay assembly 110. In an exemplary embodiment, substrate 111 is 96% alumina 0.025 inches thick, 0.85 inches wide, and 1.60 inches long. A dielectric glass layer using overglaze ink #8509 (EMCA), or equivalent, may be applied. Input/output pins 112, 114, 116, and 118 protrude 0.36 inches and are spaced 0.20 inches to 0.49 inches apart from one another.

FIG. 5 is a derating curve for the solid state relay assembly 10, described above. It is estimated that the above solid state relays have a thermal resistance of 10° C. per watt. When the ambient air temperature exceeds 30° C., the assembly 10 is less able to shed heat and the junction temperatures of SCR1 and SCR2 will rise to unacceptable levels if the maximum current is not limited. For example, at an ambient temperature of 60° C., the load current maximum will be just over three amps. A similar derating curve to FIG. 5 will apply to solid state relay 110.

FIGS. 6A, 6B, and 6C show one way the thermally conductive epoxy coating can be formed to cover solid state relay assembly 10. The epoxy forms a block one inch by 1.70 inches by 0.50 inches. A mold can be used for this purpose with the assembly 10 placed in the mold, molten epoxy poured in, and then allowed to cure according to the epoxy manufacturer's instructions. Certain relay applications will depend on the solid state relay having a minimum thickness dimension. Instead of the square shape shown in FIGS. 6A-6C, it may be advantageous to coat the solid state relay substrate and components with a thin epoxy coating that forms a skin-like membrane.

A major advantage in the use of copper for the metallization of the substrates 11 and 111 has been observed for alumina based substrates. By applying particular firing techniques and temperature profiles known in the prior art of ceramic metallization, copper can be made to molecularly bond with the alumina. If such a copper metalized alumina substrate is used in the above solid state relays, the life and reliability of the solid state relay will be substantially improved. At a minimum, any peeling of the copper metallization layer over time, and after running at near maximum operating temperatures and currents, will be reduced or eliminated.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method of increasing the current handling capability of a given solid state relay, comprising the steps of:

splitting an AC current load into a first DC branch and a second DC branch, the direction of DC in the first branch being opposite to that of the second branch;

controlling said first DC branch with a first semiconductor device;

controlling said second DC branch with a second semiconductor device;

firing a flat ceramic substrate with a metallization layer such that a molecular bond is formed between the material of the ceramic substrate and the metal;

mounting said first and second semiconductor devices to the flat ceramic substrate having metallic heat spreader means; and encapsulating said flat ceramic substrate and said first and second semiconductor devices with a thermally conductive epoxy.

2. The method of claim 1, wherein:
the firing of the metallization layer comprises copper on an alumina ceramic substrate.

3. The method of claim 1, wherein:
the firing of the metallization layer comprises palladium silver.

* * * * *